(12) United States Patent
Pankratz et al.

(10) Patent No.: US 10,009,993 B2
(45) Date of Patent: Jun. 26, 2018

(54) CIRCUIT BOARD REFLOW OF COMPONENTS USING ON BOARD COPPER TRACES AS HEATING ELEMENT

(71) Applicant: XEROX CORPORATION, Norwalk, CT (US)

(72) Inventors: Paul L. Pankratz, Sandy, OR (US); Curtis Douglass Keller, West Linn, OR (US)

(73) Assignee: XEROX CORPORATION, Norwalk, CT (US)

( * ) Notice: Subject to any disclaimer, the term of this patent is extended or adjusted under 35 U.S.C. 154(b) by 186 days.

(21) Appl. No.: 14/256,610

(22) Filed: Apr. 18, 2014

(65) Prior Publication Data

US 2015/0305140 A1 Oct. 22, 2015

(51) Int. Cl.
H05K 7/10 (2006.01)
H05K 1/02 (2006.01)
H05K 1/16 (2006.01)

(52) U.S. Cl.
CPC ......... *H05K 1/0212* (2013.01); *H05K 1/0292* (2013.01); *H05K 1/167* (2013.01); *H05K 2203/176* (2013.01)

(58) Field of Classification Search
CPC .... B41J 2/155; B41J 2/14024; B41J 2/14072; H05K 3/321; H05K 3/361; B23K 3/0638; B23K 1/0056
USPC ........................... 174/254–264; 361/767–774
See application file for complete search history.

(56) References Cited

U.S. PATENT DOCUMENTS

| | | | | |
|---|---|---|---|---|
| 4,878,070 A * | 10/1989 | Watrobski | ............ | B41J 2/14024 347/50 |
| 5,300,959 A * | 4/1994 | McClelland | ......... | B41J 2/14072 216/13 |
| 5,471,163 A * | 11/1995 | Childers | .............. | B41J 2/17526 327/525 |
| 5,544,276 A * | 8/1996 | Loux | ....................... | F24H 1/105 137/341 |
| 5,568,171 A * | 10/1996 | Keefe | .................. | B41J 2/04543 347/211 |
| 6,053,598 A * | 4/2000 | Inpyn | ....................... | B41J 2/155 347/49 |
| 6,386,674 B1 * | 5/2002 | Corrigan, III | ....... | B41J 2/04513 347/12 |
| 2002/0071016 A1 * | 6/2002 | Wotton | .................. | B41J 11/002 347/102 |
| 2004/0210122 A1 * | 10/2004 | Sieburg | .............. | A61B 5/04085 600/393 |

(Continued)

*Primary Examiner* — Tuan T Dinh
(74) *Attorney, Agent, or Firm* — Marger Johnson

(57) ABSTRACT

An electronic circuit board has at least one copper trace, at least one array of contact pads connected to the copper trace, a heater connected to the copper trace, wherein when heat is applied to the copper trace, solder in the array of contact pads will reflow. An electronic circuit board system has an electronic circuit board. The electronic circuit board includes at least one copper trace, at least one array of contact pads connected to the copper trace, a heater connection to the copper trace, wherein when heat is applied to the copper trace, solder in the array of contact pads with reflow, and a heater to connect to the copper trace, wherein when heat is applied to the copper trace, solder in the array of contact pads will reflow.

6 Claims, 4 Drawing Sheets

(56) References Cited

U.S. PATENT DOCUMENTS

| | | | |
|---|---|---|---|
| 2006/0103695 A1* | 5/2006 | Young | B41J 2/14072 347/58 |
| 2008/0237313 A1* | 10/2008 | Fukaya | B23K 1/0056 228/227 |
| 2008/0290136 A1* | 11/2008 | Murayama | B23K 3/0638 228/8 |
| 2012/0289855 A1* | 11/2012 | Bieberich | G01K 1/165 600/549 |
| 2013/0094148 A1* | 4/2013 | Sloane | H05K 1/0212 361/708 |

* cited by examiner

CIRCUIT BOARD REFLOW OF COMPONENTS USING ON BOARD COPPER TRACES AS HEATING ELEMENT

BACKGROUND

Manufacture of printed circuit boards may result in defects such as defective attachments where the integrated circuit chips do not have a strong bond to the circuit board. Often, a customer will order printed circuit boards to install them in a larger system, such as computers, printers, TVs, etc. If the boards have defects, the customer either has to send the boards back or rework them before installing them in the larger system.

Another possibility results in the printed circuit boards being installed in the larger system and the larger system being shipped to an end customer. The defect may allow the board to operate for a period of time before failing. The end customer may have to call for field support. Currently, to repair the defect the field service technician will have to take the system back from the end user and send it out for repairs, or replace the entire circuit board on site.

These options cost much more than desired. Not only is the repair more expensive in either case, the equipment to make the repairs costs a lot of money as well. The ability to make the repairs at the end user's site or at the system manufacturer's site would keep the costs down and allow for more reliable systems.

DETAILED DESCRIPTION OF THE EMBODIMENTS

Many different devices rely upon internal circuit boards upon which are mounted integrated circuits. Typically, the integrated circuits, also called chips, mount to the circuit board by contact pads such as ball grid arrays or other types of solder contact pads. One such system may be an ink jet printer. One should note that the embodiment here may apply to many other types of devices, any device that contains a circuit board upon which are mounted other components by some sort of re-flowable material, such as solder. One should also note that the term 'circuit board' may mean other types of circuit substrates, not just rigid boards, such as flexible substrates, etc.

One reason ink jet printers are of particular interest, more specifically solid ink jet printers, is because they rely upon heaters to melt the solid ink. The heater melts the ink, which is then routed to a print head and jetted onto a print substrate to form images. U.S. Pat. No. 7,575,302 "Circuitry for Printer" discloses an approach in which a circuit includes a heater that is thermally coupled to the ink reservoirs and is used to heat the ink. The heater may be contained in one or more layers of the circuit substrate. In another approach, shown in US Publication 2013/0265369, "Patterned Heater Traces for Inkjet Printhead," an embedded heater is used to keep the ink in a molten state during transit through the print head.

Figure 1:
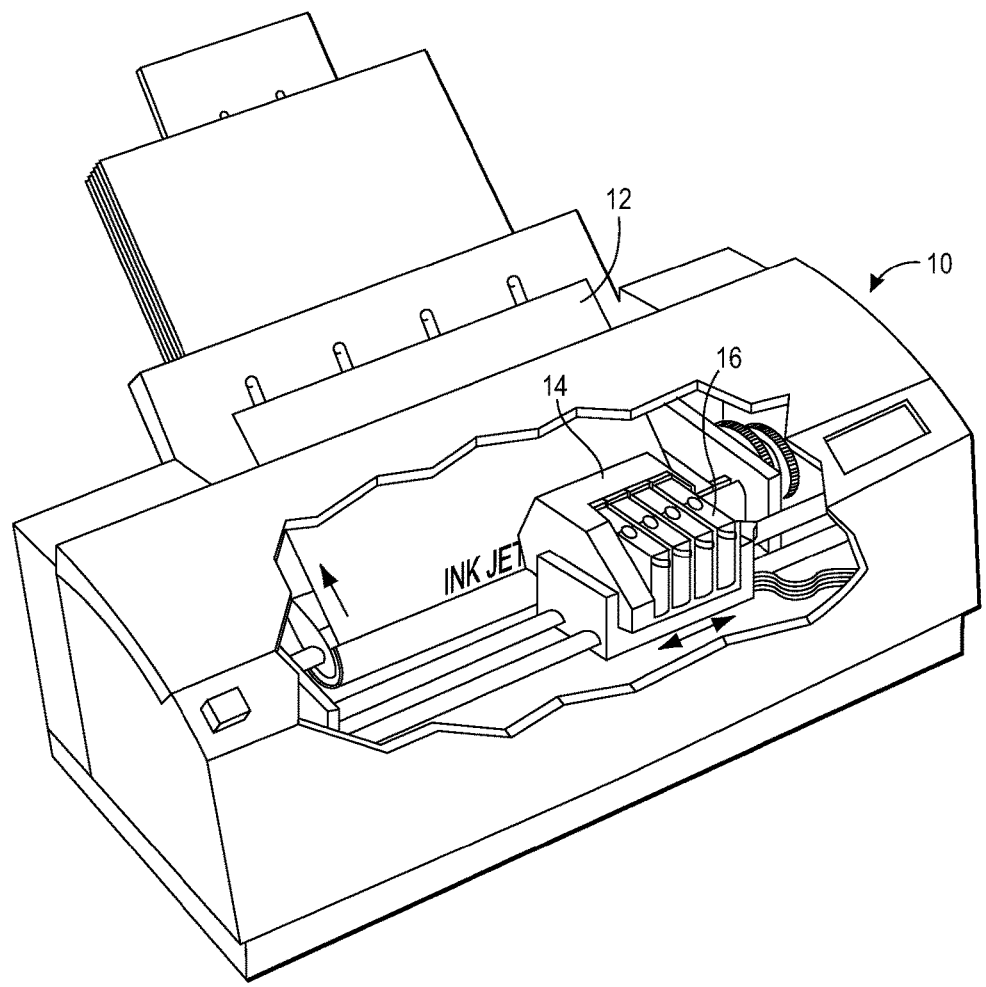
FIG. 1 shows an embodiment of a system having a printed circuit board.

The embodiments here use a substrate heater but thermally couple to the contact pads of the integrated circuits on the circuit substrate, having nothing to do with the ink paths. FIG. 1 shows an example of device that uses circuit substrates in the form of an inkjet printer. The printer 10 receives a print substrate 12, in this example a piece of paper, and routes it past a print head 14. The print head has ink reservoirs such as 16 that provide ink to a nozzle plate, not shown. The nozzle plate consists of a plate having an array of openings, also called nozzles or jets, through which ink is dispensed onto the substrate 12. In this particular example of an ink jet printer, the ink is dispensed or not depending upon signals sent from a circuit board to an array of transducers, each transducer corresponding to each jet.

Figure 2:
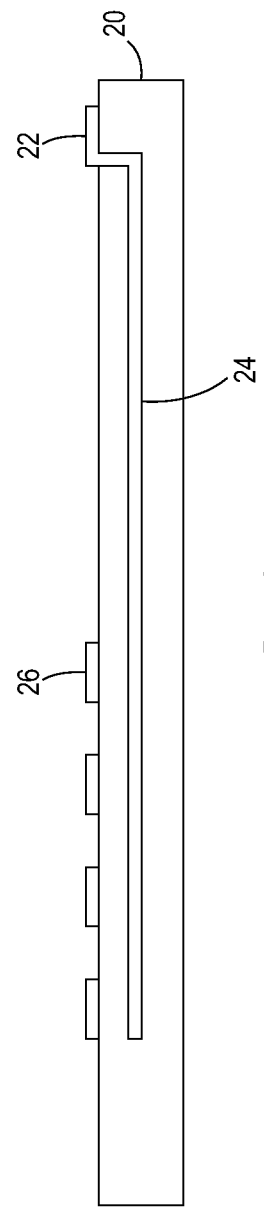
FIG. 2 shows a side view of an embodiment of a printed circuit board having a heater trace and connection.

As mentioned previously, the inkjet printer merely demonstrates one system that uses an electronic circuit board. FIG. 2 shows a circuit substrate having a heater trace internal to the substrate. The substrate 20, as mentioned before, may be a rigid electronic circuit board or a flexible substrate manufactured from any material used as a substrate for containing conductive traces. The substrate may contain one or more heater traces, such as 24. The trace 24 is electrically coupled to one or more heater connections 22. The heater connection may actually consist of a portion of a same trace used for the heater trace 24.

The trace 24 provides heat through the substrate to contact pads 26. The contact pads may be vias or through holes in the substrate through which are mounted integrated circuits, surface mount pads such as ball grid arrays or other contact pads. If an integrated circuit mounted to the substrate fails because of an incomplete connection due to a failed solder joint or other metal contact failure, the heater causes the re-flowable material to re-flow, allowing repair of the connection. This allows for repair on site, instead of having to remove the substrate/board and return it for repair.

Figure 3:
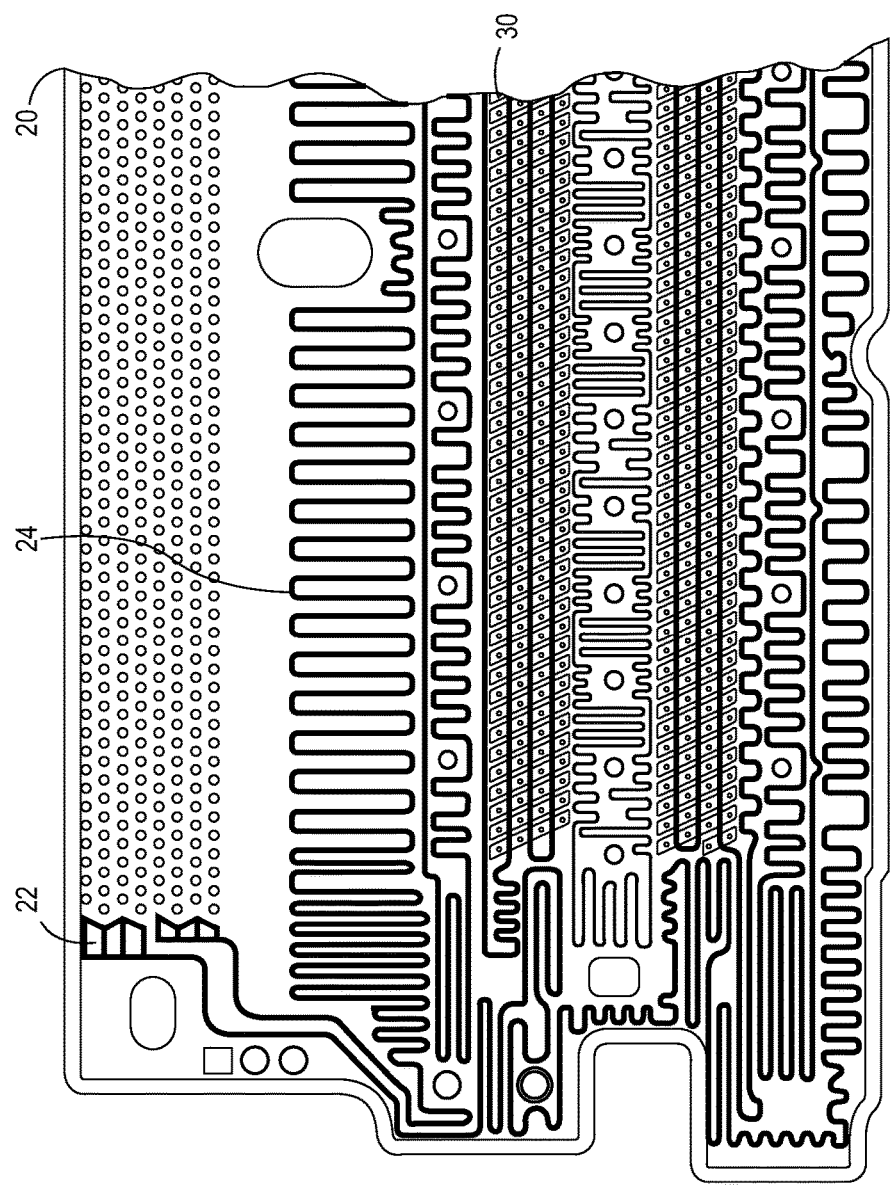
FIG. 3 shows a top view of an embodiment of a printed circuit board having a heater trace and a connection.

FIG. 3 shows the heater connections on the substrate 20 from a top view. The heater connections 22 as well as the heater traces 24 will typically reside on an interior layer of the substrate, with other layers on top of them. The connections 22 allow access to the heater traces. The heater traces heat up in response to current passing through them. The multiple folds of the heater traces 24 increase the resistance to generate heat when current is applied. The contact pads may reside in the region of the circuit board such as 30. As will be discussed with regard to FIG. 4, the current may be applied by activation of an on-board heater supply or by an external heater circuit. In the case of the external heater circuit, the heater connections will consists of a connection or connector that allows the external heater to connect to the heater traces. In the case of an on-board heater, the heater connections may consist of a diode or switch that allows the heater control to provide current to the heater traces.

Figure 4:
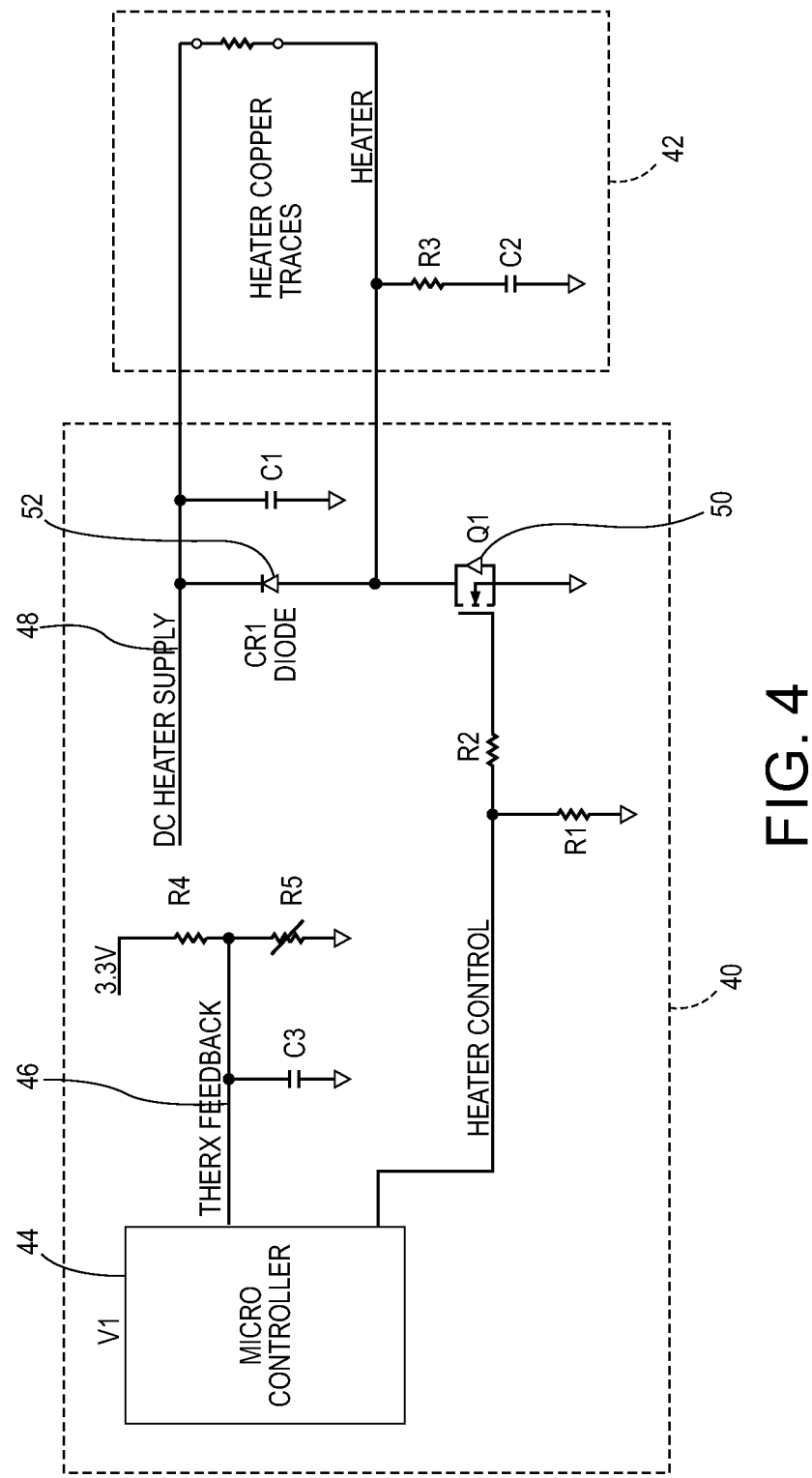
FIG. 4 shows an embodiment of a schematic for a heater circuit.

In FIG. 4, the heater supply and control reside as part of a heater drive circuit 40, with the actual heater traces being part of the circuit substrate 42. This separation provides only one example of the ways the different functions could be divided. For example, the components could be separated as heater control, heater supply and the heater traces. The heater traces will reside on the circuit substrate, but the heater control and heater supply may be separated from each other, on the same circuit or device, or one or the other may be on the substrate and the other on the device.

In the particular example of FIG. 4, the heater control includes a microcontroller 44. This is programmable and allows control over the turning on and off of the heater supply 48. In order to ensure that the heater has enough current driven for a long enough time to reach the proper temperature, a temperature feedback thermistor or other temperature sensitive device 46 will provide a measure of the temperature. In the example of FIG. 4, the thermistor and heater control reside on the circuit substrate.

The microcontroller 44 communicates with the heater supply 40 through a switch such as 50. In this example, the 'on' signal causes a transistor Q1 to conduct, in turn activating the heater supply 48 with the heater traces 42. The diode 52 acts a circuit protector and prevents any reverse signal to reach the switch 50.

Once the heater turns on and the heater traces 42 heat up, the thermistor regulates the temperature. In its simplest form, the thermistor may just be used to determine when the substrate or region of the substrate reaches a desired temperature. It may also be used to determine if the temperature of the substrate exceeds a higher temperature that would cause damage to the integrated circuits or substrate itself.

In this manner, heat may be provided to an entire circuit substrate or just a region of the substrate to allow repair of connections made with re-flowable materials such as solder or conductive adhesives. The regional control may be achieved by temperature control, where the traces closest to the heater supply may become warm first with further traces becoming warm later in a heating cycle, if desired. The heater may be shut off after the first region reaches the desired heat. As an alternative, more than one set of heater traces may reside in the substrate, allowing for more localized control of the heating. In any of the above examples, the embodiments provide a means to repair defects on site and possible even while the circuit substrate resides inside the system into which is was installed.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An electronic circuit board system, comprising:
    an electronic circuit board, having:
        at least one heater trace internal to a substrate of the electronic circuit board;
        at least one array of contact pads on the surface of the substrate, wherein the contact pads are of re-flowable material;
        a heater connection electrically coupled to the heater trace, such that when current is applied to the heater trace at least a region of the substrate adjacent the array of contact pads heats up to a temperature to cause the re-flowable material of the contact pads to reflow; and
    a heater to connect to the heater connection and apply current to the heater trace.

2. The system of claim 1, wherein the heater is located on the electronic circuit board.

3. The system of claim 1, wherein the heater is an external heater to the electronic circuit board.

4. The system of claim 1, wherein the heater connection comprises a copper trace having a length sufficient to provide a resistance that causes the trace to generate heat.

5. The system of claim 3, wherein the external heater includes a microcontroller.

6. The system of claim 3, wherein the external heater has a connector adapted to connect to the heater trace on the circuit board.

* * * * *